(12) United States Patent
Kim et al.

(10) Patent No.: US 8,771,540 B2
(45) Date of Patent: *Jul. 8, 2014

(54) HIGHLY DILUTABLE POLISHING CONCENTRATES AND SLURRIES

(71) Applicant: Fujifilm Planar Solutions, LLC, Adrian, MI (US)

(72) Inventors: Hyungjun Kim, Gilbert, AZ (US); Richard Wen, Mesa, AZ (US); Bin Hu, Chandler, AZ (US); Minae Tanaka, Gilbert, AZ (US); Deepak Mahulikar, Madison, CT (US)

(73) Assignee: Fujifilm Planar Solutions, LLC, North Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/848,484

(22) Filed: Mar. 21, 2013

(65) Prior Publication Data

US 2013/0288478 A1 Oct. 31, 2013

Related U.S. Application Data

(60) Continuation of application No. 13/402,365, filed on Feb. 22, 2012, now Pat. No. 8,404,143, which is a division of application No. 12/580,868, filed on Oct. 16, 2009, now Pat. No. 8,192,644.

(51) Int. Cl.
*C03C 15/00* (2006.01)

(52) U.S. Cl.
USPC .......... 216/88; 252/79.1; 252/79.2; 252/79.3; 252/79.4; 438/693

(58) Field of Classification Search
USPC ............ 252/79.1–79.4; 438/693; 216/88, 100
See application file for complete search history.

(56) References Cited

U.S. PATENT DOCUMENTS

| | | |
|---|---|---|
| 4,059,929 A | 11/1977 | Bishop |
| 6,428,721 B1 | 8/2002 | Ina et al. |
| 7,419,911 B2 | 9/2008 | Chelle et al. |
| 2003/0052308 A1 | 3/2003 | Hu |
| 2005/0090106 A1 | 4/2005 | Bian |
| 2006/0000151 A1 | 1/2006 | Kelley et al. |
| 2006/0138087 A1 | 6/2006 | Simka et al. |

(Continued)

FOREIGN PATENT DOCUMENTS

| | | |
|---|---|---|
| EP | 1700893 A1 | 9/2006 |
| JP | 20010271165 | 1/2004 |

(Continued)

OTHER PUBLICATIONS

International Search Report dated Dec. 13, 2010 for PCT/US2010/052844.

(Continued)

*Primary Examiner* — Lan Vinh
*Assistant Examiner* — Maki Angadi
(74) *Attorney, Agent, or Firm* — Ohlandt, Greeley, Ruggiero & Perle, LLP (57) ABSTRACT

The present disclosure provides a concentrate for use in chemical mechanical polishing slurries, and a method of diluting that concentrate to a point of use slurry. The concentrate comprises abrasive, complexing agent, and corrosion inhibitor, and the concentrate is diluted with water and oxidizer. These components are present in amounts such that the concentrate can be diluted at very high dilution ratios, without affecting the polishing performance.

14 Claims, 8 Drawing Sheets

(56) References Cited

U.S. PATENT DOCUMENTS

| | | |
|---|---|---|
| 2007/0212289 A1 | 9/2007 | Park et al. |
| 2008/0254628 A1 | 10/2008 | Boggs et al. |
| 2009/0095939 A1 | 4/2009 | Chou et al. |
| 2009/0267021 A1 | 10/2009 | Nakajo et al. |
| 2010/0144245 A1 | 6/2010 | Chang et al. |

FOREIGN PATENT DOCUMENTS

| | | |
|---|---|---|
| KR | 20080023443 | 3/2008 |
| KR | 20090036987 | 4/2009 |
| WO | 2008150038 | 12/2008 |

OTHER PUBLICATIONS

CoppeReady Cu3900 slurry, Made by Nanomaterials (http://www.nanoslurry.com/datasheet.cu3900_product_sheet_final.pdf).

Korean Office Action (with English translation) dated Oct. 31, 2012 for Korean application No. 10-2012-0088557.

Extended European Search Report dated Jun. 5, 2013 for European application No. 10824165.4.

Japanese Office Action (with English translation) dated Oct. 29, 2013 for Japanese application No. 2012-534394.

HIGHLY DILUTABLE POLISHING CONCENTRATES AND SLURRIES

CROSS-REFERENCE TO RELATED APPLICATIONS

The present application is a continuation application claiming priority to U.S. patent application Ser No. 13/402,365, filed Feb. 22, 2012, now U.S. Pat. No. 8,404,143, which is in turn a divisional of U.S. patent application Ser No. 12/580,868, filed on Oct. 16, 2009, now U.S. Pat. No. 8,192,644, each of which is incorporated herein by reference.

BACKGROUND OF THE DISCLOSURE

1. Field of the Disclosure

The present disclosure relates to concentrates that can be diluted for use in wafer polishing applications. In particular, the present disclosure relates to a concentrate that can be diluted as much as 50× or more, while still maintaining optimal or near optimal polishing performance.

2. Description of the Related Art

The process known as chemical-mechanical polishing (CMP) involves polishing different layers on semiconductor wafers, using a polish pad and a slurry. Copper is a commonly used material for forming interconnects in semiconductor manufacturing. Once a copper inlaid structure is formed by, for example, a damascene process, the isolated copper wires are made by polishing and clearing copper and barrier metal between the inlaid wires. Copper and barrier layer CMP involves polishing of copper and barrier layers. It is desired to polish the wafers at a high removal rate of material to enhance throughput, while still maintaining favorable wafer characteristics such as a low number of overall defects.

Figure 1:
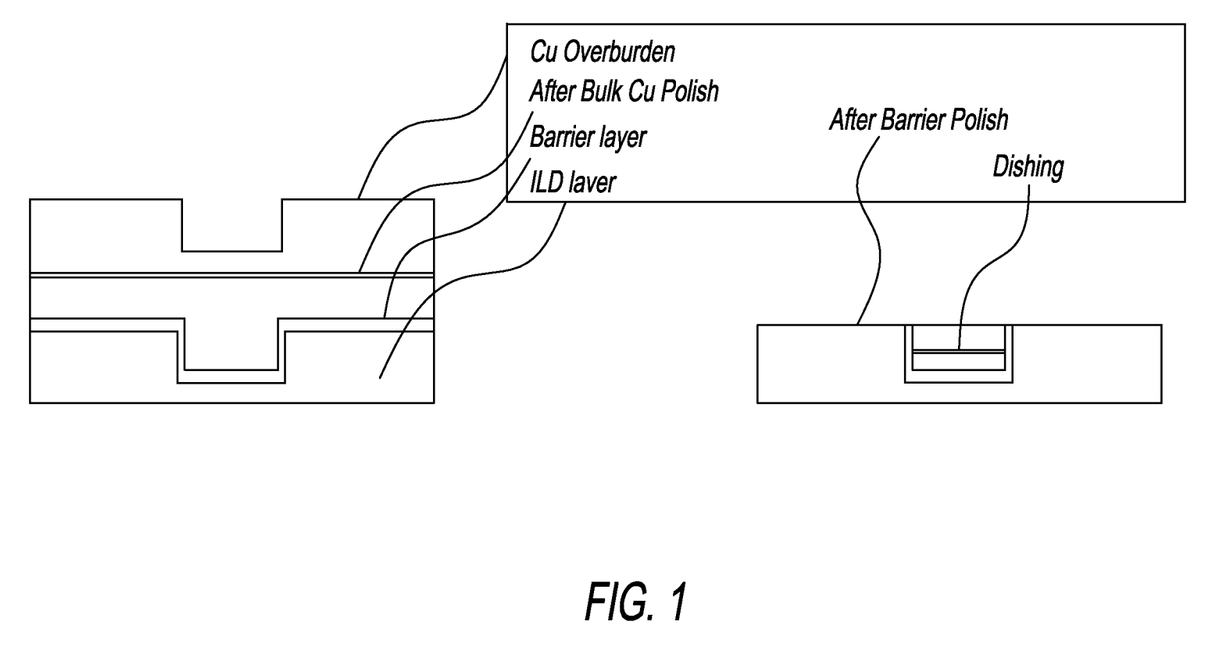
FIG. 1 is a depiction of a copper CMP process.

A typical copper CMP process consists of 3 process steps. First, the electro-plated copper overburden (up to 2 μm in thickness depending on technology node) is rapidly polished down at a relatively high down force, leaving some amount of copper until the deposition topography is fully planarized. (See FIG. 1) Throughput and planarization efficiency and low defects are key needs. Then, the remaining copper overburden after full planarization during the first step is polished off at a lower down force, with a stop on the barrier layer. The goal is to clear all copper from the barrier metal, but achieve significantly low dishing on the inlaid copper wire, with very low defects and improved surface roughness. Throughput is also important. This step can be combined with the first step, depending on the polisher type or configuration. Lastly, the thin barrier layer left after the second step, generally Ta or TaN, or both, is polished off with significant topography correction, low erosion and low defects. The slurry for the first two steps may be the same or different. The barrier layer slurry, however, is usually a different composition.

Sometimes copper CMP slurries are made as concentrates. These concentrates have the benefit of being cheaper to make and ship, which reduces the cost of ownership (COO) of the CMP slurry. The customer can simply add water and oxidizer at the point of use (POU), to form the POU slurry. One problem with this method, however, is that the concentrate must be properly designed to work well at the POU. By definition, a concentrate has much higher amounts of all the components than would be found in the POU slurry. However, it is not possible to make an unlimitedly high concentrated polishing composition, as would be preferable in a concentrate, because of stability and shelf life issues. In a colloidal slurry, stability is governed by particle surface effects, which depend on the type, amount, and chemistry of the particular particle. The higher the amount of abrasive in a slurry, the more the likelihood of instability. For example, if a POU polishing composition contains 1% abrasive, 1% removal rate enhancer, and 1% corrosion inhibitor, then a 10× Concentrate would be 10% abrasive, 10% removal rate enhancer, and 10% corrosion inhibitor, which could be highly unstable. Thus, CMP polishing compositions are made at a concentrate level where they are stable for at least 6 months of shelf life.

The disadvantage to these slurries, however, is that they can not be highly diluted (i.e. on an order of 10× or 20×), which adds to the cost of the CMP slurries ultimately needed for the polishing application. In addition, at higher dilutions, there is the risk that copper removal rates would be adversely affected, since at lower concentrations of abrasive and removal rate enhancer, one skilled in the art would expect the removal rate of copper to be less. The same holds true for any corrosion inhibitors used in the slurry—if the amount of corrosion inhibitor is diluted too much, the resulting slurry may not prevent corrosion of the copper inlays as much as is desired.

The prior art clearly shows that the more a concentrate is diluted, the more the performance of the resulting POU slurry will suffer. For example, U.S. Pat. No. 6,428,721, to Ina et al., lists several exemplary copper-polishing slurries in Table 1. The examples of that disclosure all comprise abrasive, hydrogen peroxide, alanine or glycine, and water. Table 1 clearly shows that the performance of the slurry drops off significantly as the slurry is diluted. When comparing Example 6 to Example 11, one can see that Example 11 is a 5× dilution of Example 6, since there is one-fifth as much abrasive in Example 11 as there is in Example 6. Consequently, Example 11 exhibits a drastically reduced removal rate of copper when compared to Example 6.

Another reference showing the relationship between copper removal rate and dilution is U.S. Patent Application Publication No. 2008/0254628, to Boggs et al. FIGS. 9 and 10, and the accompanying text in ¶¶123-124, very clearly illustrate that as the dilution of a CMP slurry increases, the copper removal rate drops off dramatically.

This relationship between dilution and polishing performance is also illustrated in the data sheet for the CoppeReady® Cu3900 slurry, made by DA Nanomaterials, and available at http://www.nanoslurry.com/datasheet/cu3900_product_sheet_final.pdf. The data sheet shows that when a slurry is diluted from a 4:1 strength to 9:1, the removal rate can be very severely affected, and can drop as much as 50%, depending on the downforce applied to the slurry.

Thus, there is a need for a concentrate that can be used in CMP slurries, which is stable, yet does not suffer from decreased performance when diluted to high levels, as this is very desirable from a COO standpoint.

SUMMARY OF THE DISCLOSURE

The present disclosure provides a concentrate that can be diluted to form a CMP slurry. The concentrate comprises abrasive, complexing agent, corrosion inhibitor, and water, in addition to other optional ingredients. To prepare a POU slurry based on this concentrate, the user will add an oxidizer, and additional water, to the desired levels. When these ingredients are mixed according to the formulas described below, the concentrate of the present disclosure can be diluted at a rate of up to 50× or more, while still maintaining excellent performance.

In another embodiment, the present disclosure provides a method of preparing a chemical mechanical polishing slurry. The method comprises the step of adding water and oxidizer to a concentrate, wherein the concentrate comprises about 0.5 wt % to about 10 wt % of an abrasive, about 1 wt % to about 20 wt % of a complexing agent, and a corrosion inhibitor. The water and oxidizer can be added to the concentrate in an amount governed by the formula:

$$0.8 \leq [\text{oxidizer}]/f \leq 2.0,$$

wherein $f=A+B*[\text{complexing agent}]^C$, wherein A is between 0.35 and 0.8, B is between 0.3 and 0.5, and C is about 1, and [oxidizer] and [complexing agent] are the amounts of the oxidizer and complexing agent in the chemical mechanical polishing slurry, respectively.

DETAILED DESCRIPTION OF THE DISCLOSURE

Figure 2:
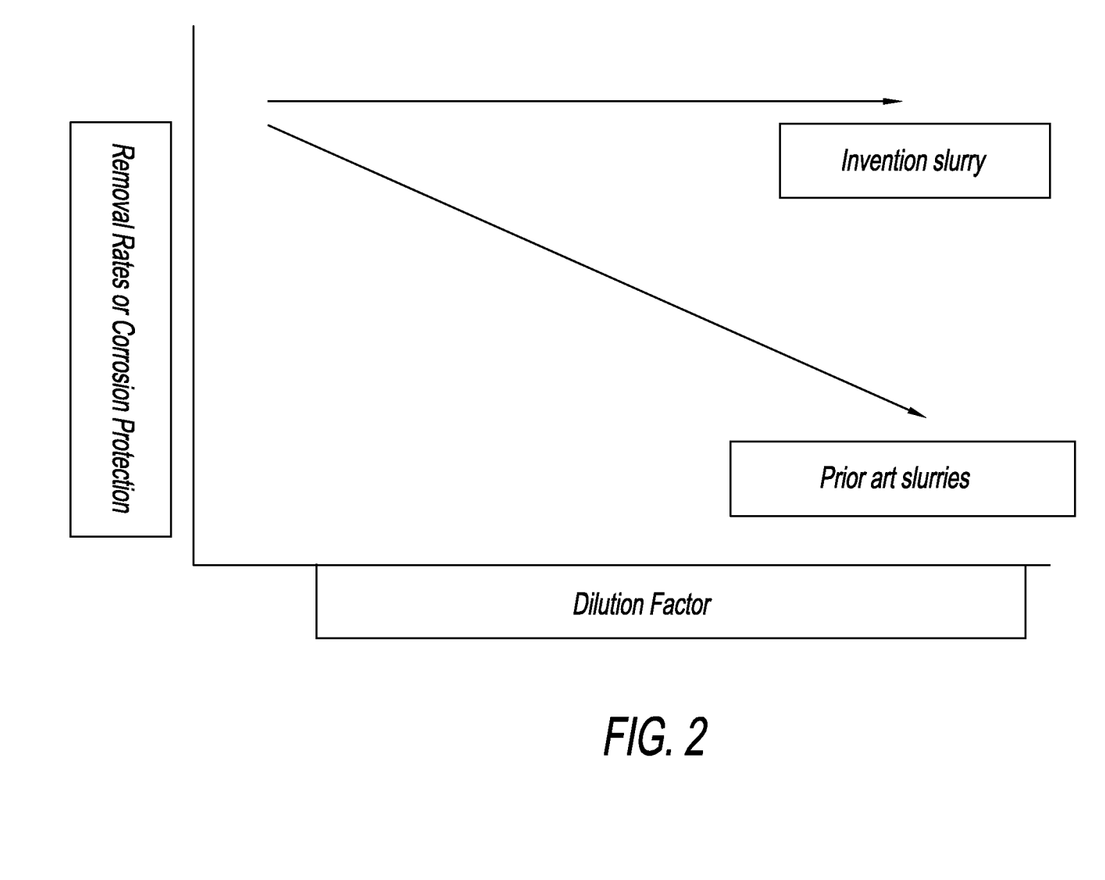
FIG. 2 is a graphical representation of the concentrates of the prior art when compared to those of the present disclosure.

The present disclosure provides copper polishing CMP concentrates that are highly dilutable, but retain key functional parameters such as high removal rates, favorable wafer topography, and low and defects, such as corrosion. The CMP concentrates of the present disclosure can be diluted to up to 20× or more, and exhibit no significant change in performance over less diluted concentrates, for example 10× or 5× slurries. This is highly advantageous, in that users can minimize the amount of concentrate they need to keep on hand, thus keeping costs down, while maintaining the desired level of performance of the CMP slurry in the polishing application. FIG. 2 shows this relationship graphically. As previously discussed, it was thought in the prior art that the more the concentrate was diluted, the more the performance parameters would suffer, since the abrasive and removal rate enhancer concentrations would decrease. The present disclosure, however, has provided a concentrate that maintains strong performance parameters at very high dilution levels. The user can take the concentrate, and add oxidizer and water at the POU, to the desired level.

In CMP, metal layers are removed by a combination of chemical and mechanical forces. With copper, dissolution (or ionization) takes place at the surface of the copper. The removal of copper ions can be enhanced by a reaction with a complexing agent that can form a complex with the copper layer. This complex is typically softer or more porous than the copper layer before the CMP slurry is applied, so it can be removed more easily. An oxidizer is also useful in CMP slurries, as it forms a copper oxide layer, which is also more easily removed. When removing the bulk copper layer, very high removal rates are needed, for example as high as 10000 A/min, so it is desirable to use powerful complexing agents and oxidizers. If the chemistry is strong, however, it can be highly corrosive to copper, and can create corrosion defects such as pitting or copper loss. Thus, a proper corrosion inhibitor can be used in the CMP slurry. Abrasives are also a critical part of the removal of copper materials, and must have the proper hardness and morphology to remove copper oxide quickly. Ideally, a thin, soft, copper oxide and complex forms, and is rapidly removed without any corrosion, so it is important to balance the four components described above. Again, however, the more a solution is diluted, the more difficult it will be to balance the amounts of these four components, leading to a dramatic decrease in removal rate of the copper compounds.

The formation of the copper oxides and complexes depend on the strength of the oxidizers and corrosion inhibitors used. A very strong oxidizer and corrosion inhibitor will result in thick hard oxide layer on the copper. The passivation rate, or P, can be defined as the rate at which the oxide layer is formed, and is usually measured as a rate of thickness increased per unit of time, for example Angstrom/min. The removal of this layer can be mechanical as well as chemical. The mechanical rate of removal of the complex and oxide layer, or M, is defined as the thickness removed per unit of time, for example Angstrom/min.

Without being bound by this theory, the present disclosure believes that when P>M, the process is chemistry driven and the copper removal rates are lower than the ideal or peak values. When M>P, the removal process is primarily mechanical, and the copper removal rates are also lower than ideal or peak values. When P≈M, the process runs on a balance of chemical and mechanical forces. The removal rates are optimal and high.

The present disclosure provides a concentrate that takes advantage of these principles, and which can be diluted to a POU slurry. The concentrate comprises abrasive, complexing agent, corrosion inhibitor, water, and optional additional ingredients, in the amounts and as discussed below. To prepare the POU slurry, the user will add water and oxidizer to the concentrate. The amount of dilution that a user will require for a particular application will depend on several factors, though clearly, the less concentrate that is used to make a POU slurry, the more advantageous it is in terms of cost and material usage. A user will dilute the concentrate to a point at which significant cost and materials savings are realized, but the resulting POU still performs to the desired level.

To establish a relationship between the amount, or concentration, of complexing agent, and the amount of oxidizing agent present in the POU slurry, the present disclosure first defines the following function:

$$f(\text{complexing agent})=A+B*[\text{complexing agent}]^C$$

A, B and C are constants for a particular formula. A can be from 0.35 to 0.8, and has a unit of measurement identical to that for the complexing agent, in this case weight percentage. In one embodiment, B can be from 0.3 to 0.5, or 0.33 to 0.46. C can vary slightly, but will remain about 1. B and C are unitless constants. The use of brackets in the present disclosure, e.g. "[complexing agent]", denotes the concentration of the ingredient within the brackets, in this case the complexing agent. Unless otherwise specified, in the present disclosure concentration is expressed as a weight percentage of the concentrate as a whole.

When preparing the POU slurry, the ratio of the amount of oxidizing agent to the function $f$, i.e. [oxidizing agent]/$f$, is known as the "oxidizer ratio." The oxidizer ratio should be between about 0.8 and about 2.0, or about 0.8 and about 1.3. The amounts of the oxidizing agent and the complexing agent in the POU slurry should be chosen so that they satisfy this relationship. This will ensure that P≈M, which as described above provides optimal conditions for the CMP process. When these conditions are satisfied, the present disclosure has provided a highly dilutable concentrate for use in copper CMP applications, wherein copper removal rates stay high and stable after diluting down to 20× or beyond, wherein corrosion resistance remains high, and surface roughness remains low. This is highly advantageous over currently available concentrates. The concentrate further comprises abrasives and corrosion inhibitors, as discussed below, as well as several optional additional ingredients such as surfactants, biocides, surface finishers, pH adjusters, and defect reduction agents.

The abrasives can be selected from the group consisting of alumina, fumed silica, colloidal silica, coated particles, titania, ceria, zirconia, or any combinations thereof. In one embodiment, the abrasive is colloidal silica. The abrasives can be present in an amount of about 0.5 wt % to about 10 wt %, or in an amount of about 1 wt % to about 5 wt %, each based on the total amount of concentrate.

The oxidizer can be selected form the group consisting of hydrogen peroxide, ammonium persulfate, silver nitrate ($AgNO_3$), ferric nitrates or chlorides, per acids or salts, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMgO_4$, other inorganic or organic peroxides, or mixtures thereof. In one embodiment, the oxidizer is hydrogen peroxide. The oxidizer can be present in an amount so that the POU slurry has about 0.1 wt % to about 5 wt % of oxidizer, or from about 0.4 wt % to about 2 wt %, so long as it satisfies the above-described relationship to the amount of complexing agent.

The complexing agent can be any compound that performs the desired function. In one embodiment, the complexing agent is selected from the group consisting of organic acids and their salts, amino acetic acids, amino acids such as glycine or alanine, carboxylic acids, polyamines, ammonia based compounds, quaternary ammonium compounds, inorganic acids, compounds with both carboxylic and amino functions, such as ethylenediaminetetraacetic acid and diethylene triamine pentaacetic acid, or any mixtures thereof. In another embodiment, the complexing agent is glycine. The complexing agent can be present in an amount of about 1 wt % to about 20 wt %, or about 5 wt % to 13 wt %, each based on the total weight of the concentrate.

The corrosion inhibitor can be selected from the group consisting of benzotriazole and its derivatives, tolyl triazole and its derivatives, and azoles, certain surfactants, or any mixtures thereof. In one embodiment, the corrosion inhibitor is a benzoriazole derivative. The corrosion inhibitor can be present in an amount of about 100 ppm to about 10,000 ppm, based on the weight of the concentrate, or a range of about 100 ppm to about 2000 ppm. The corrosion inhibitor can also be present in an amount so that the POU slurry has about 10 parts per million (ppm) to about 1000 ppm, or from about 10 ppm to about 200 ppm.

Figure 3:
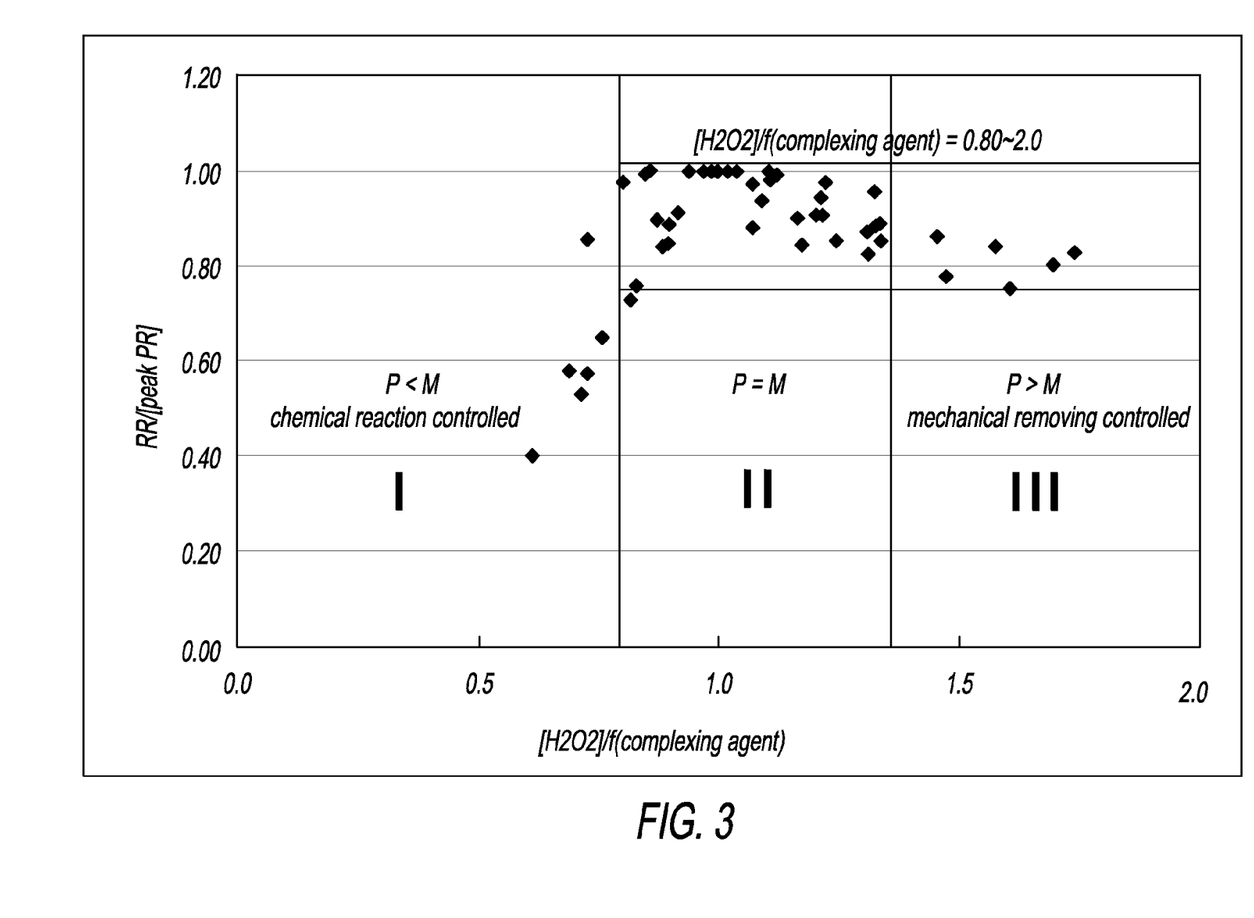
FIG. 3 is a plot of the ratio of a function of the amount of complexing agent to the amount of oxidizer in the concentrate, vs. the normalized copper removal rate of the slurry.

Referring to FIG. 3, a plot of the oxidizer ratio vs. the normalized removal rate, i.e. the ratio of actual removal rate to the peak removal rate, is shown. When the oxidizer ratio is between 0.8 and 2.0, the normalized removal rate is higher than 0.75, which is regarded as a high removal rate range providing relatively stable and reproducible removal rate values. When the ratio is between 0.8 and 1.3, i.e. when P≈M, the normalized removal rate is even higher, almost always over 0.8, and is often at 1.0, meaning that the slurry is operating at the peak removal rate.

Figure 4:
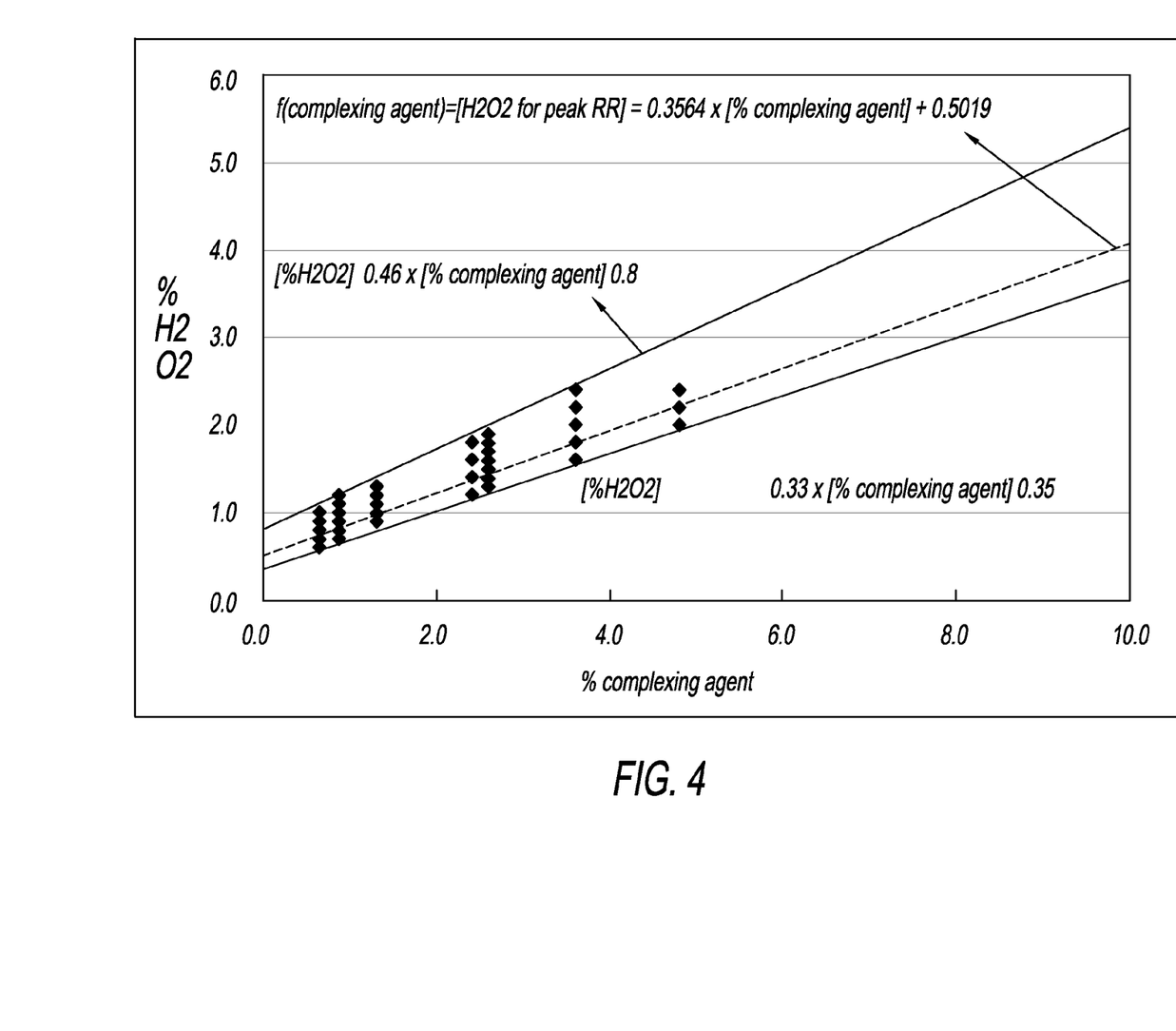
FIG. 4 shows a plot of the amount of complexing agent versus oxidizer for several different embodiments of the present disclosure.

FIG. 4 shows a plot of the amount of oxidizer that can be present at a given complexing agent concentration, according to one embodiment of the present disclosure, where the oxidizer ratio is 1.0. In the shown embodiment of FIG. 4, A is between 0.35 and 0.8, and B is between 0.33 and 0.46. In the region of the plot between the two solid lines, the slurry will provide a normalized removal rate of 0.8 or greater. If the slurry has complexing agent and oxidizer concentrations that are outside this region, the performance of the slurry will drop. FIG. 4 also shows, in dotted line, the relationship between the concentrations of complexing agent and oxidizer at the peak removal rate for the slurry.

Figure 5:
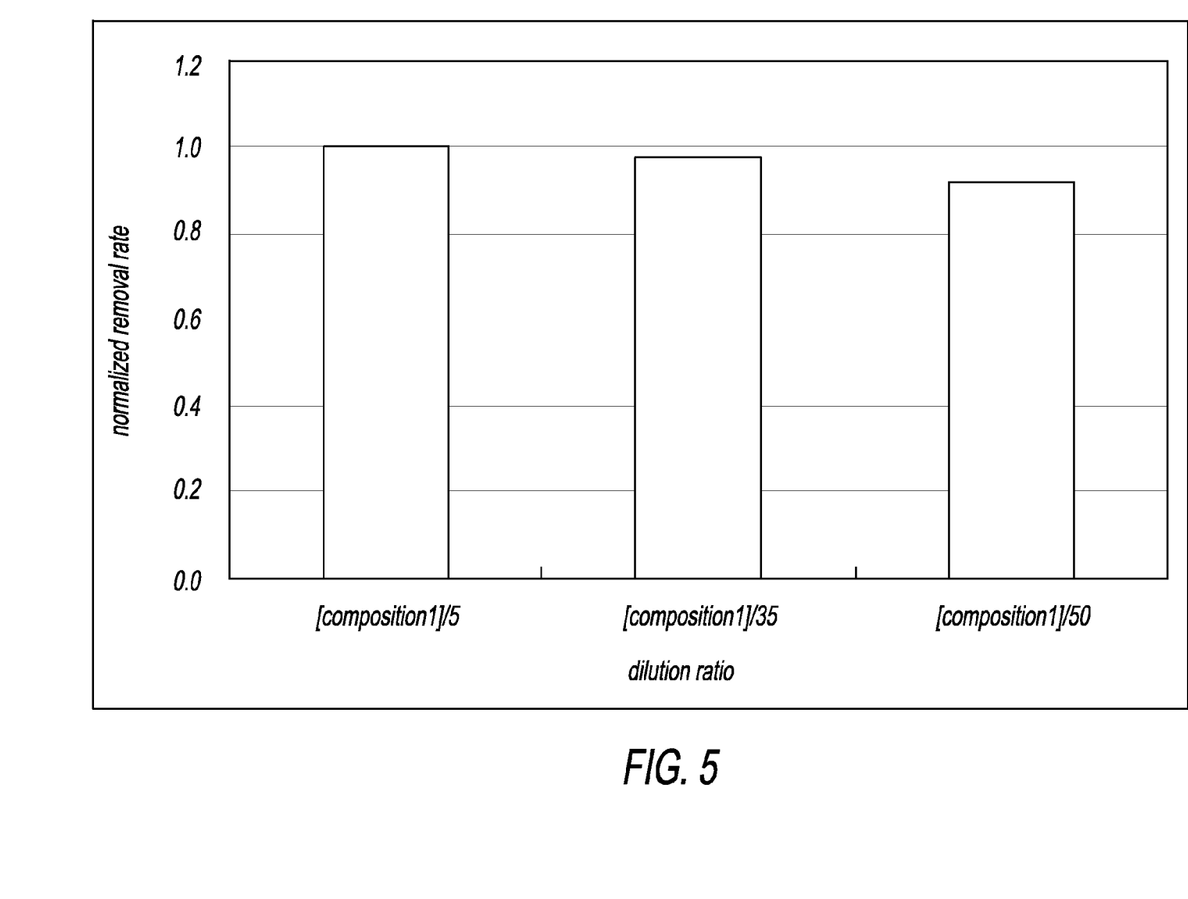
FIG. 5 shows the normalized removal rates for three CMP slurries according to the present disclosure.

FIG. 5 shows the normalized removal rates for three CMP slurries according to the present disclosure. The tests were conducted using an Applied Materials Mirra polisher, a RHEM IC1010 polishing pad, and at a 3 p.s.i. polishing down force. The shown compositions were prepared using a concentrate comprising 13 wt % of complexing agent, 1 wt % abrasives, and a pH of about 7.5. Composition 1 is a 5× dilution of the concentrate of the present disclosure. As can be seen, even when Composition 1 is diluted 7× (i.e., a 35× dilution of the concentrate), or even 10× (i.e., a 50× dilution of the concentrate), the removal rate remains very high. The 50× dilution CMP slurry still operates at 90% of the removal rate of the 5× dilution CMP slurry.

Figure 6:
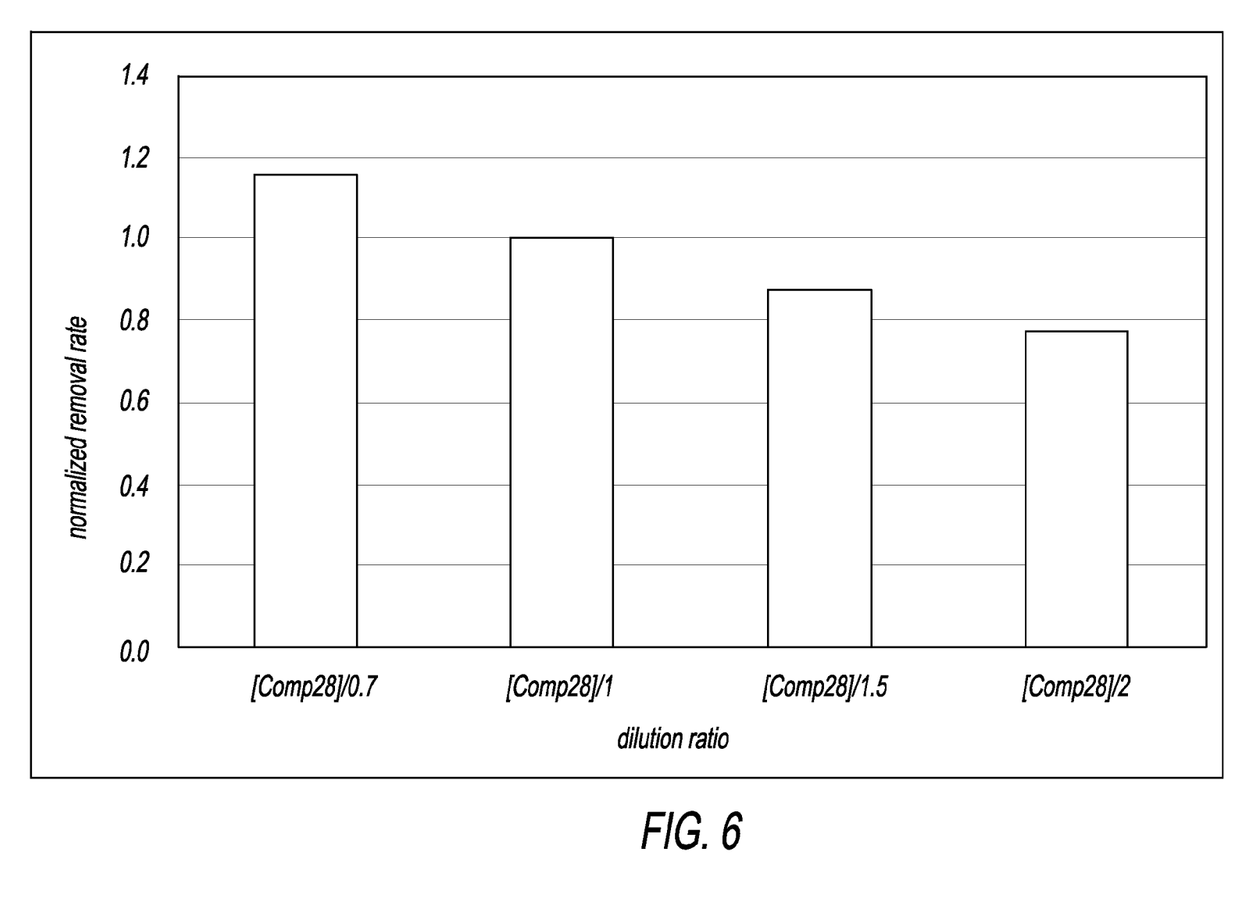
FIG. 6 shows a plot of the performance of a prior art slurry/concentrate according to the prior art at several dilution levels.

By contrast, FIG. 6 shows the performance of a prior art slurry/concentrate according to the prior art. Comp28 is Comparative Example 2 of Table 1 in U.S. Pat. No. 6,428,721, which was discussed above. The data shown have been reproduced using Comp28 with various dilution ratios. When Comp28 is diluted, there is a dramatic drop-off in the performance—at just 2× dilution, the normalized removal rate has already dropped below 0.8. This effect is even more pronounced when Comp28 is compared to a more concentrated formulation of itself, as shown in FIG. 6. Clearly, then, the performance of the slurries of the prior art suffers significantly when the slurries are diluted.

Figure 7:
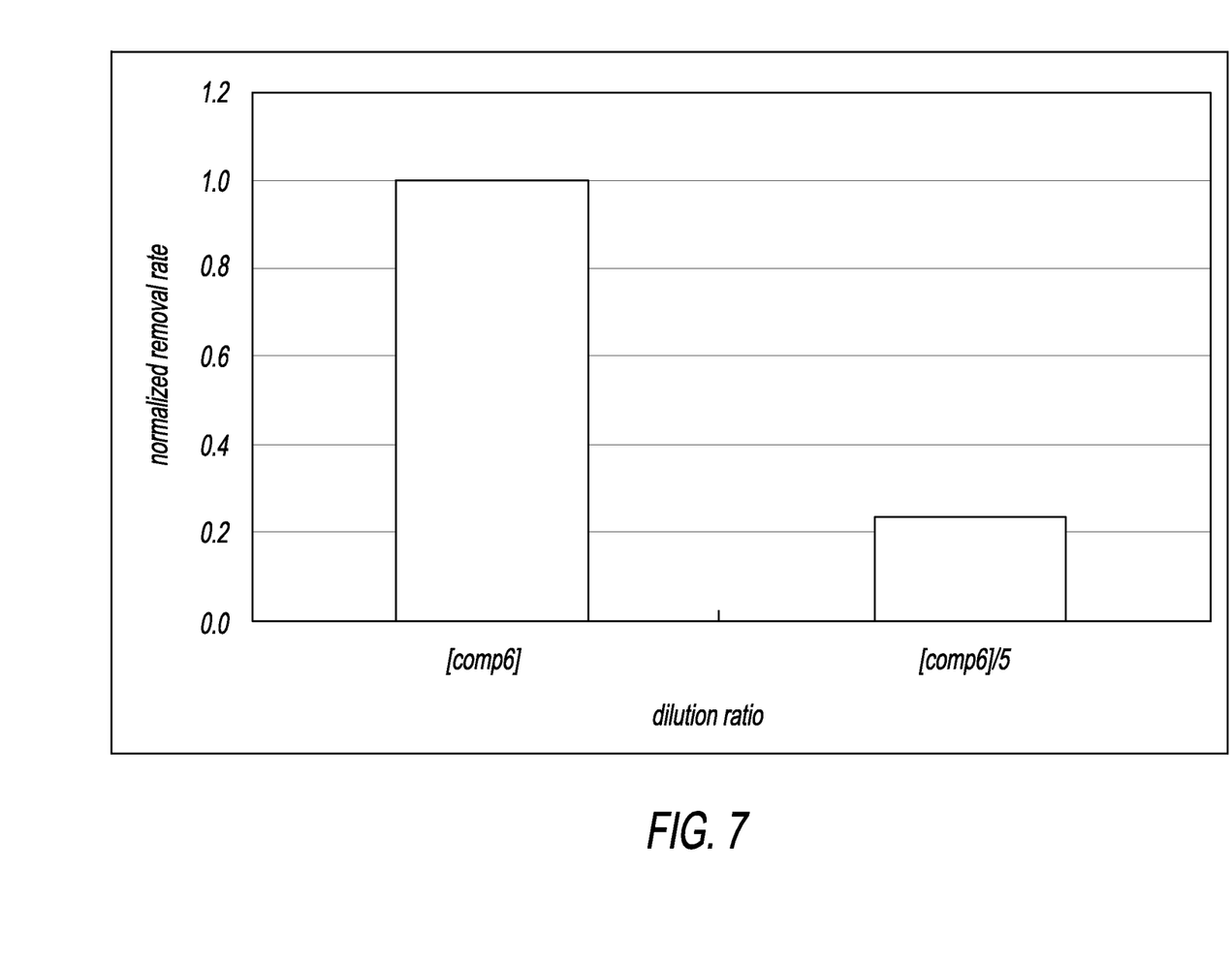
FIG. 7 shows a plot of the performance of an additional slurry/concentrate of the prior art.

FIG. 7 shows an even more drastic example of a prior art CMP slurry whose removal performance suffers dramatically when it is diluted. FIG. 7. Comp6 is example 6 of Table 1 in U.S. Pat. No. 6,428,721. When Comp6 is diluted 5×, the normalized removal rate drops off almost 80%. Again, this shows that the performance of prior art slurries suffers significantly when they are diluted.

Figure 8:
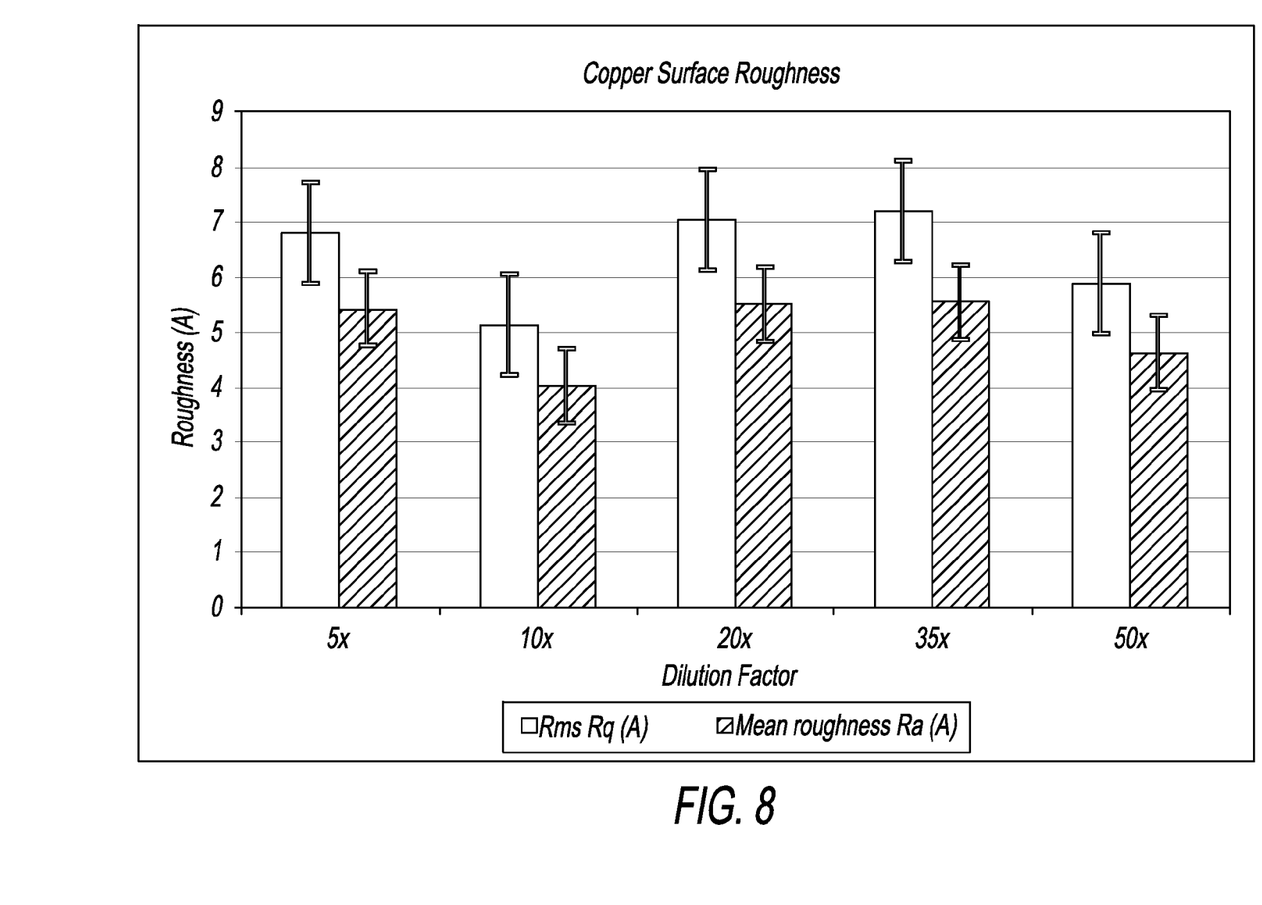
FIG. 8 shows a plot of the copper surface roughness of wafers polished with several different slurries according to the present disclosure.

FIG. 8 shows surface roughness data for several slurries according to the present disclosure. As can be seen in the Figure, slurries diluted to various levels all exhibited similar surface roughness data, within acceptable noise levels. There is a minor drop in the surface roughness of the 10× slurry, but this is not considered statistically significant.

It should be noted that in the present disclosure, dilution ratios as high as 20× were achieved without any loss of functional performance at all, and higher ratios, such as the 50× described above, were achieved with minimal performance loss. Higher dilution rates are also possible if one accepts lower optimal copper removal rates. If, instead of 80% of the peak removal rates, one can accept 60%, the dilution ratio can be increased, to as much as more than 50×.

The following list defines some of the terms used in the present disclosure.

highly dilutable: 5× or more dilution complexing agent for copper: a compound forming a soluble or insoluble complex with copper oxidizers for copper: chemicals that oxidize the copper atoms to a higher valence state corrosion inhibitor: chemicals that protect the copper surface from corroding abrasive: solid particles that aid in mechanical removal of wafer surface normalized removal rate: the ratio of a particular removal rate to that of a reference, such as the peak removal rate, or the removal rate of a baseline composition peak removal rates: the highest removal rate for a given slurry oxidizer level for peak removal rate: the oxidizer concentration that corresponds to the peak removal rate oxidizer ratio: the ratio of the peroxide concentration to the concentration of the complexing agent optimally high copper removal rates: removal rates within 75% of the peak removal rates The present disclosure having been thus described with particular reference to the preferred forms thereof, it will be obvious that various changes and modifications may be made therein without departing from the spirit and scope of the present invention as defined in the appended claims.

What is claimed is:

1. A method of preparing a chemical mechanical polishing slurry, comprising:
    adding water and oxidizer to a concentrate, wherein said concentrate comprises:
        about 0.5 wt % to about 10 wt %, based on the total weight of the concentrate, of an abrasive;
        about 1 wt % to about 20 wt %, based on the total weight of the concentrate, of a complexing agent; and
        a corrosion inhibitor,
        wherein said water and said oxidizer are added to said concentrate in an amount governed by the formula:

$0.8 \leq [\text{oxidizer}]/f \leq 2.0$, wherein $f = A + B*[\text{complexing agent}]^C$,
    wherein A is between 0.35 and 0.8, B is between 0.3 and 0.5, and C is about 1, and
    [oxidizer] and [complexing agent] are the amounts of the oxidizer and complexing agent in the chemical mechanical polishing slurry, respectively, to form the chemical mechanical polishing slurry.

2. The method of claim 1, wherein $0.8 \leq [\text{oxidizer}]/f \leq 1.3$.

3. The method of claim 1, wherein said oxidizer is present in an amount of about 0.1 wt % to about 5 wt %, based on the total amount of the chemical mechanical polishing slurry.

4. The method of claim 3, wherein said oxidizer is present in an amount of about 0.4 wt % to about 2 wt %, based on the total amount of the chemical mechanical polishing slurry.

5. The method of claim 1, wherein said corrosion inhibitor is present in an amount of 0.001 wt % to about 1 wt %, based on the total weight of the concentrate.

6. The method of claim 1, wherein said corrosion inhibitor is present in an amount of 0.001 wt % to about 0.2 wt %, based on the total weight of the concentrate.

7. The method of claim 1, wherein B is between 0.33 and 0.46.

8. The concentrate of claim 1, wherein said abrasive is selected from the group consisting of alumina, fumed silica, colloidal silica, coated particles, titania, ceria, zirconia, and any combinations thereof.

9. The concentrate of claim 1, wherein said complexing agent is selected from the group consisting of organic acids and their salts, amino acetic acids, amino acids, glycine, alanine, carboxylic acids, polyamines, ammonia based compounds, quaternary ammonium compounds, inorganic acids, compounds with both carboxylic and amino functions, ethylenediaminetetraacetic acid, diethylene triamine pentaacetic acid, and any mixtures thereof.

10. The concentrate of claim 1, wherein corrosion inhibitor is selected from the group consisting of benzotriazole and its derivatives, tolyl triazole and its derivatives, and azoles.

11. The method of claim 1, wherein said concentrate is diluted with said water so that said abrasive, said complexing agent, and said corrosion inhibitor are present in amounts in said chemical mechanical polishing slurry that are at least five times less than in said concentrate.

12. The method of claim 1, wherein said concentrate is diluted with said water so that said abrasive, said complexing agent, and said corrosion inhibitor are present in amounts in said chemical mechanical polishing slurry that are at least ten times less than in said concentrate.

13. The method of claim 1, wherein said concentrate is diluted with said water so that said abrasive, said complexing agent, and said corrosion inhibitor are present in amounts in said chemical mechanical polishing slurry that are at least twenty times less than in said concentrate.

14. A method of removing a copper layer from a substrate, comprising the step of contacting the copper layer with the chemical mechanical polishing slurry of claim 1, wherein the chemical mechanical polishing slurry removes said copper layer at a rate that is at least 75% of a peak removal rate of the chemical mechanical polishing slurry.

\* \* \* \* \*